United States Patent
Arora et al.

(10) Patent No.: US 8,211,625 B2
(45) Date of Patent: Jul. 3, 2012

(54) METHOD OF FORMING A LOCALLY PERIODIC 3D STRUCTURE WITH LARGER-SCALE VARIATION IN PERIODIC PROPERTIES AND APPLICATIONS THEREOF

(75) Inventors: William J. Arora, Cambridge, MA (US); George Barbastathis, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 878 days.

(21) Appl. No.: 12/266,869

(22) Filed: Nov. 7, 2008

(65) Prior Publication Data
US 2009/0135391 A1 May 28, 2009

Related U.S. Application Data

(60) Provisional application No. 60/986,071, filed on Nov. 7, 2007.

(51) Int. Cl.
*G02F 7/20* (2006.01)
(52) U.S. Cl. .................. 430/321; 355/67; 359/652
(58) Field of Classification Search .................. None
See application file for complete search history.

(56) References Cited

U.S. PATENT DOCUMENTS

2006/0286488 A1   12/2006   Rogers et al.
2007/0097470 A1*  5/2007    Schneider et al. .......... 359/10

OTHER PUBLICATIONS

Jeon et al., "Molded transparent photopolymers and phase shift optics for fabricating three dimensional nanostructures" Optics Express, vol. 15, No. 10, pp. 6358-6366.
Bitta et al., "Large-Area 3D Nanostructures with Octagonal Quasicrystalline Symmetry via Phase-Mask Lithography" Advanced Materials, 2007, pp. 1403-1407.
Shir et al., "Three-Dimensional Nanofabrication with Elastomeric Phase Marks" J. Phys. Chem. 2007, 2007 American Chemical Society, pp. 12945-12958.
Jeon et al., "Fabricating complex three-dimensional nanostructures with high resolution conformable phase marks" PNAS, Aug. 24, 2004, vol. 101, No. 34, pp. 12428-12433.
Jeon et al., "Fabricating three dimensional nanostructures using two photon lithography in a single exposure step" Optics Express, Mar. 20, 2006, col. 14, No. 6, pp. 2300-2308.
Sung et al., "Analog Micro-Optics Fabrication by Use of a Binary Phase Grating Mask" Proceedings of the SPIE, SPIE, Bellingham VA; US; vol. 5347; No. 1; Jan. 1, 2004, pp. 62-70.
Zanke et al., "Large-area patterning for photonic crystals via coherent diffraction lithography" J. Vac. Sci. Technology B. 22 (6); Nov./Dec. 2004, 2004 American Vacuum Society, vol. 22, No. 6, pp. 3352-3355.
Jeon et al., "Three dimensional nanoporous density graded materials formed by optical exposures through conformable phase masks" Applied Physics Letters 89, 2006 American Institute of Physics, pp. 253101-1-253101-3.
Feng et al., "Subwavelength fractional Talbot effect in layered herterostructures of composite metamaterials" Physical Review E, vol. 74, No. 3, Sep. 2006, pp. 3612-1-036612-5.

* cited by examiner

*Primary Examiner* — John A. McPherson
(74) *Attorney, Agent, or Firm* — Gesmer Updegrove LLP

(57) ABSTRACT

An optical structure is provided. The optical structure includes a substrate structure. A photosensitive material layer is positioned on said substrate structure. The photosensitive material layer having uniform periodic geometry and a period length throughout associated with a 2D periodic pattern. The 2D periodic pattern includes a period length greater than the exposing light wavelength and spatial variation in the duty cycle of the features of a mask layer used in the formation of said 2D periodic pattern.

21 Claims, 4 Drawing Sheets

8

10   12

16

METHOD OF FORMING A LOCALLY PERIODIC 3D STRUCTURE WITH LARGER-SCALE VARIATION IN PERIODIC PROPERTIES AND APPLICATIONS THEREOF

This application claims priority from provisional application Ser. No. 60/986,071 filed Nov. 7, 2007, which is incorporated herein by reference in its entirety.

PRIORITY INFORMATION

This invention was made with government support awarded by the National Science Foundation under Contract No. DGE-0645960 and the Army Research Office under Contract No. W911NF-07-D-0004. The government has certain rights in the invention.

BACKGROUND OF THE INVENTION

The invention is related to the field of optics, and in particular to a technique of forming a periodic, three-dimensionally micro-structured material with a two-dimensional variation in micro-structure duty cycle.

Coherent diffraction lithography, also known as the Talbot effect and the self-imaging effect, is a method for optically replicating periodic structures. The effect occurs when a periodic amplitude or phase mask is illuminated by coherent light. Optical images of the periodic mask are formed at interval distances behind the mask, known as Talbot distances. By placing a photo-film at one Talbot distance, the grating is copied by exposing and developing the film. If the photopolymer is several Talbot distances thick, the periodic pattern will be copied into it at each Talbot distance. Exposing and developing the film will create a periodic porous micro-structure out of the polymer. The 2D periodic pattern of the exposure mask determines what 3D geometry is formed. Many 3D geometries have been made including face centered cubic and body centered tetragonal. Varying the exposure dose controls what fraction of the photopolymer remains behind, or how thick the micro-structure is.

These 3D structures are typically made in photopolymers such as SU-8 but could be made in any photosensitive material using either one-photon or two-photon exposure. The main limitation of the Talbot effect is that it can only be used to replicate periodic patterns. This is very well known and efforts to replicate non-periodic patterns, even for periodic patterns with single element defects, do not work. This is because the patterns become blurred out in the photopolymer.

SUMMARY OF THE INVENTION

According to one aspect of the invention, there is provided a method of fabricating an optical structure. The method includes providing a substrate structure and positioning a photosensitive material layer on the substrate structure. Moreover, the method includes positioning a mask layer on the photosensitive material layer. The mask layer includes a 2D periodic pattern with period length greater than the exposing light wavelength and having spatial variation in the duty cycle of the features of the mask layer. Moreover, the method includes illuminating with a light source the mask layer and photosensitive material layer to form a 3D micro-structure having uniform periodic geometry and period length throughout associated with the 2D periodic pattern.

According to another aspect of the invention, there is provided a system for fabricating an optical structure. The system includes a substrate structure and a photosensitive material layer is positioned on the substrate structure. A mask layer is positioned on the photosensitive material layer. The mask layer includes a 2D periodic pattern with period length greater than the exposing light wavelength and should have spatial variation in the duty cycle of the features of the mask layer. A light source illuminates the mask layer and the photosensitive material layer to form a 3D micro-structure having uniform periodic geometry and period length throughout associated with the 2D periodic pattern.

According to another aspect of the invention, there is provided an optical structure. The optical structure includes a substrate structure. A photosensitive material layer is positioned on said substrate structure. The photosensitive material layer having uniform periodic geometry and a period length throughout associated with a 2D periodic pattern. The 2D periodic pattern includes a period length greater than the exposing light wavelength and spatial variation in the duty cycle of the features of a mask layer used in the formation of said 2D periodic pattern.

DETAILED DESCRIPTION OF THE INVENTION

This invention relates to a technique of forming a periodic three-dimensionally (3D) micro-structured material, with a two-dimensional (2D) variation in micro-structure duty cycle. The structure is formed by optical exposure through a contact amplitude photomask. It is discovered that optical exposure can replicate spatial variations in the duty cycle of periodically spaced features on a photomask in the optical field produced behind said mask. The optical field has the same lateral periodic spacing as the mask features and is also periodic vertically, forming a 3D pattern. The wider an attenuating mask feature is (or larger the duty cycle), the darker the optical field behind said mask feature and vice versa.

Figure 1A:
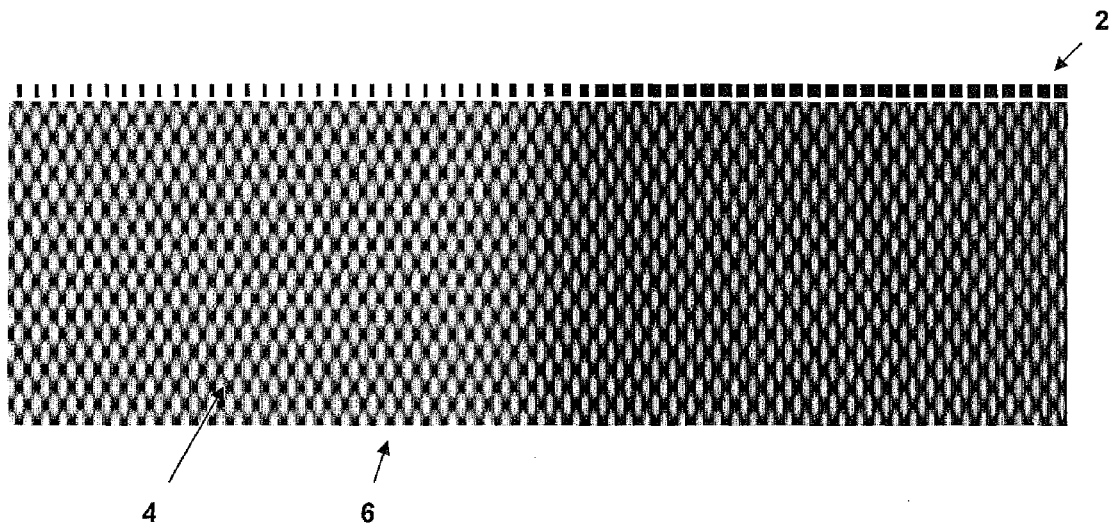
FIG. 1A is a Fresnel simulation of optical intensity within a cross-section of a photosensitive material formed in accordance with the invention.
Figure 1B:
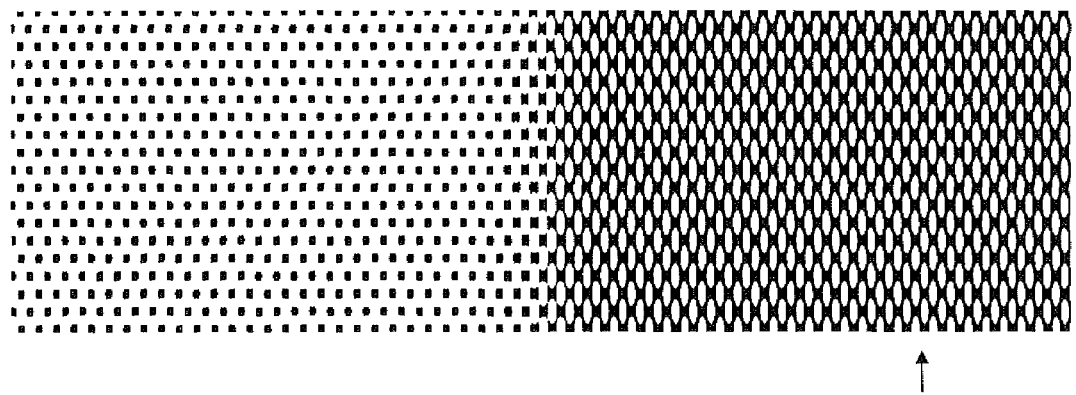
FIG. 1B is a computer simulation of the photosensitive material structure after the exposure of FIG. 1A and development.

FIG. 1A shows a Fresnel simulation of optical intensity 2 within a cross-section of a photosensitive material 6. Exposure light (400 nm wavelength) is incident on a mask from the top and forms the optical pattern 4 shown. FIG. 1B is a computer simulation of photosensitive material structure 14 after the exposure of FIG. 1A and development. The minimum distance over which the duty cycle can be significantly varied (for example, from 25% to 75%) is approximately 10 mask periods. The exact distance depends on mask, polymer and properties of the exposing light field and can be determined by computer simulation. As long as the duty cycle modulation is sufficiently gradual, there is no blurring of the optical exposure in the photopolymer.

Figure 2A:
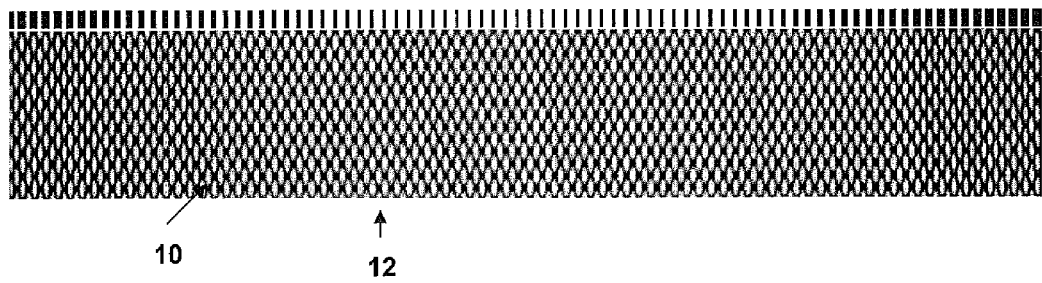
FIG. 2A is a Fresnel simulation of optical intensity within a cross-section of a second photosensitive material formed in accordance with the invention.
Figure 2B:
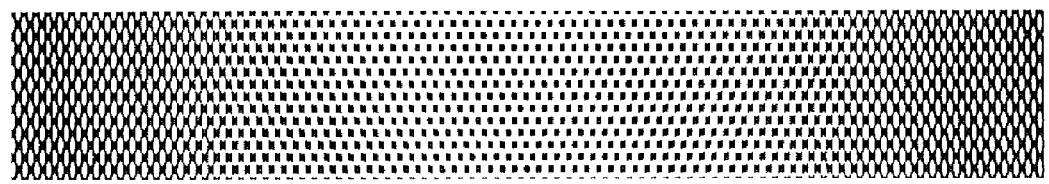
FIG. 2B is a computer simulation of the photosensitive material structure after the exposure of FIG. 2A and development.

FIG. 2A shows a Fresnel simulation of optical intensity 8 within a cross-section of a photosensitive material 12 having a parabolic duty cycle. Exposure light (400 nm wavelength) is incident on the mask from the top and forms the optical pattern 10 shown. FIG. 2B is a computer simulation of photosensitive material structure 16 after the exposure of FIG. 2A and development.

The optical intensity within the photosensitive material will have a 3D periodic patterns 4, 10, examples of which are shown in FIGS. 1A and 2A. After exposure, the photosensitive material 6, 12 is developed. The result is a 3D microstructure 6, 12 with uniform periodic geometry and period length throughout, but areas that received more or less dose will be more or less porous, respectively. It is important that enough of the original material remains to form a stable 3D micro-structure that will not collapse.

FIGS. 1B and 2B show examples of what the developed micro-structure could look like for the exposure patterns of FIGS. 1A and 2A. In FIGS. 1A and 2A, a negative resist was used (exposed areas remained behind). It is also possible to use a positive resist to obtain the inverted structure. The gradient in duty cycle of the mask becomes a gradient in pore size of the 3D micro-structure and is replicated uniformly through the entire thickness of the photosensitive material without blur and minimal distortion. The gradient is only shown in 1D; however, the gradient may be 2D. The resulting unique 3D structure has many applications.

Figure 3:
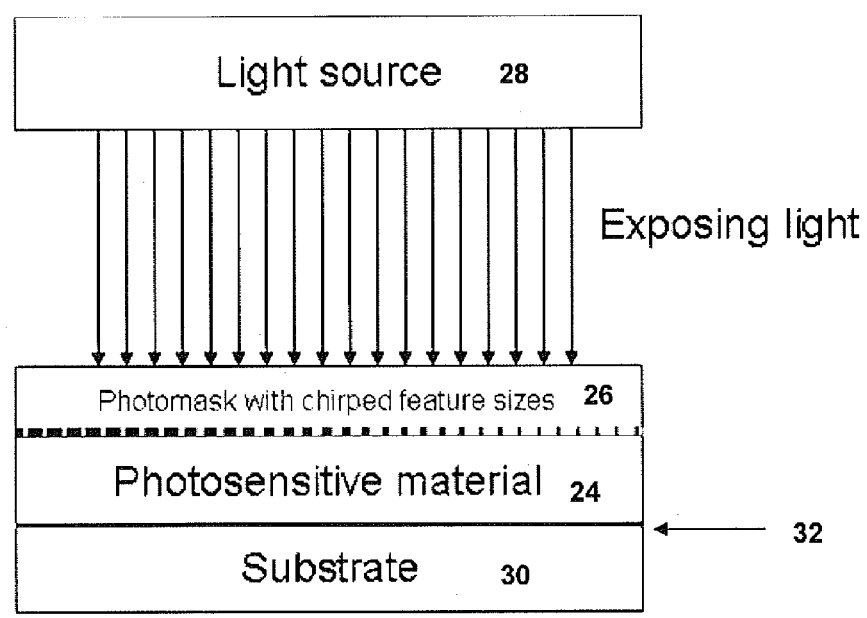
FIG. 3 is schematic diagram illustrating the preferred technique of practicing the invention.

The invention is practiced by exposing a photosensitive material 24 with an amplitude contact mask 26, as shown in FIG. 3. In the preferred embodiment, the exposing light source 28 is monochromatic and spatially coherent (for example, collimated laser light). However, monochromatic light that is not perfectly spatially coherent can also be used (for example, a filtered lamp). In most cases the exposing light will be normally incident on the contact mask 26, but off-axis illumination will also work. The photosensitive material (usually a polymer or glass) 24 should be flat to make good contact with the mask 26 features. Typically, the photosensitive material 24 will be spun or deposited onto a flat substrate 30 to the desired thickness (typically 5-500 um). Light reflection at the substrate-photosensitive material interface 32 should be minimized although this is not required.

Reflection minimization is accomplished with an anti-reflection coating, by using an optically transparent substrate (for example, quartz), or any well known method from the field of optical lithography. The mask 26 should have a 2D periodic pattern with period length greater than the exposing light wavelength and should have spatial variation in the duty cycle of the mask features. The spatial variation should be approximately 10 times lower frequency (or less) than the mask 26 feature spacing frequency. In the preferred embodiment, the mask 26 features are fully attenuating; typically 60 nm of metal such as chromium will suffice. However, phase masks or part-amplitude, part-phase masks can be used as well. The mask 26 should be placed in conformal contact to the photosensitive material 24, and then illuminated with the exposing light source 28.

The 3D micro-structure formed by using the invention is a useful optical structure because of the refractive index contrast between the photosensitive material and air. If the structure is illuminated with light of wavelength much larger than the micro-structure period (for example 1000 nm light incident on a 400 nm period structure, or visible light incident on a 200 nm period structure) the incident light sees only a spatially averaged refractive index instead of discrete regions of high and low index. The local refractive index at any point will be the average of the photosensitive material and air refractive indices, weighted by the size of each.

For example, if the air pore is 70% of the micro-structure period with refractive index of 1 and the photosensitive material is 30% of the micro-structure period with refractive index of 1.5, the averaged refractive index is 0.7×1+0.3×1.5=1.15. Where the polymer micro-structure is more porous, the effective index will be smaller and vice versa. The structure therefore has a gradient index (GRIN) and can be used as a GRIN optic. A lens is achieved by a radial parabolic effective refractive index modulation.

GRIN lenses are currently manufactured by chemical diffusion of impurities (Ag is common) into glass. Where the impurities are of highest concentration, the refractive index is lowest. To our knowledge the maximum dielectric contrast achieved by this process is 0.09. The refractive index modulation resulting from diffusion can only be parabolic; this happens to work well for making lenses, but still has aberrations. The minimum lens diameter found is 500 um with a numerical aperture of 0.53 and a lens length of 1.15 mm.

In comparison, GRIN lenses formed by the technique described herein have many advantages over the existing chemical diffusion process. The refractive index contrast is higher, and depends on the material used. If a 3D micro-structure is made in a polymer such as SU-8, which has a refractive index of 1.6 in the visible, the refractive index contrast will be 0.3, assuming a 50% duty cycle modulation. If the 3D micro-structure is made in a photosensitive inorganic material such as arsenic sulfide which has a refractive index of 2.5 in the visible (and 2.3 in the infrared) the index contrast will be at least 0.75.

Furthermore, techniques of recasting a polymer 3D microstructure into a different material can be used to create higher refractive index structures. For example, infiltrates a polymer micro-structure with $TiO_2$, and then selectively removes the polymer. $TiO_2$ has a refractive index of 2.5 in the visible, so the resulting refractive index contrast will be about 0.75. The freedom to choose lens material (polymer photoresist, inorganic photoresist, or recasted material) is another advantage.

For example, GRIN lenses made out of polymer could be used as contact lenses. The higher index contrast enables higher numerical aperture and axially shorter lenses. Depending on the amount of index contrast, the lenses could be one third as long or shorter. The minimum lens diameter depends on parameters used to create the 3D micro-structure and is probably about 20 um. Simulations show that a 42 um diameter lens is feasible using the microstructures of FIGS. 2A and 2B.

There is no limit to the maximum size of the lens. The ability to define custom index gradients (not necessarily radially parabolic) allows one to make aberration corrected lenses. This invention allows GRIN lenses to be made directly on a substrate, aligned to other features such as a charge-coupled or CMOS device array. Alternatively, the substrate can be removed after the GRIN is formed. The fabrication of GRIN lenses by this method is fast (<15 minutes for optical exposure and development), low cost (the masks are the most expensive component but can be reused indefinitely), and mass manufacturable (many GRIN lenses can be made side-by-side with a single mask exposure). The only possible challenge in making GRIN lenses this way is that they may need to be several hundred microns thick.

If the technique cannot expose such a thick material, the lens may have to be made in several separate layers, by exposing and developing the first layer, then depositing the second on top, exposing and developing it, etc. If necessary, each layer can be exposed with a different mask to create step-variations of duty cycle, or any other parameter including period, geometry or the like, in the vertical direction.

Figure 4:
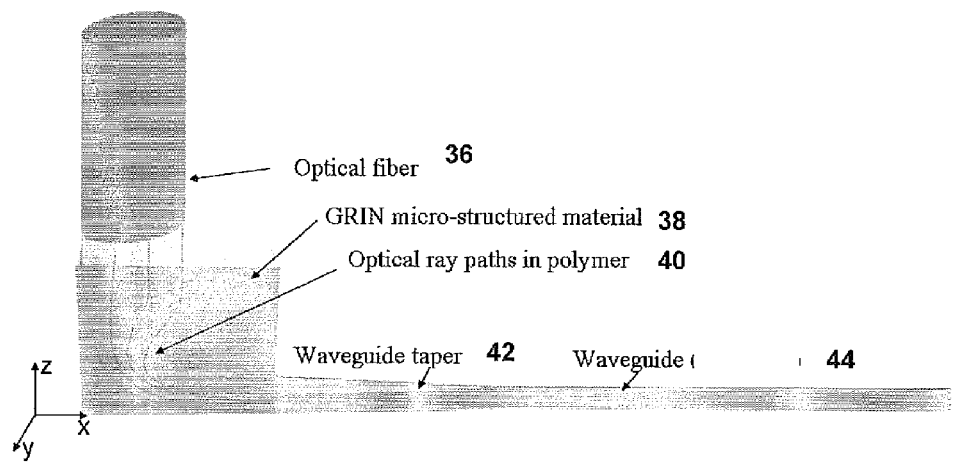
FIG. 4 is a schematic diagram illustrating an ideal fiber to waveguide coupler bends in accordance with the invention

The GRIN optics formed by the invention can have nearly arbitrary 2D refractive index gradients and are not limited only to creating lenses. A fiber to on-chip-waveguide light coupler 34 can be made out of a GRIN formed by the invention, as shown in FIG. 4. This coupler 34 requires a non-parabolic refractive index gradient, so it cannot be made by impurity diffusion. The current method of making these couplers is to deposit a film and vary the composition of it (and hence its refractive index) as it is deposited. This results in a 1D refractive index gradient through the thickness of the film.

The ideal fiber to waveguide coupler 34 bends the light rays 40 as shown. This can be achieved with a custom GRIN 38. The GRIN 38 will be formed in the x-y plane, and must be rotated 90° so that GRIN is in the x-z direction. The FIG. 4 shows the coupler 34 after being rotated into place. A waveguide taper 42 is used to accomplish matching with a waveguide 44.

This structure 38 will couple light vertically from a fiber 36 into a waveguide 44, but a 2D refractive index gradient will achieve higher efficiency (theoretically 100%). The 2D GRIN 38 can be made using the techniques described herein. However, the gradient must be in vertical direction and the direction of the waveguide 44 coupled to the coupler 34. Therefore, after the photosensitive material is exposed with the appropriate contact mask and developed, it must be rotated 90° by a mechanical micro-fabrication technique. Alternately, the GRIN optic can be fabricated separately, rotated, and placed onto the chip.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating an optical structure comprising:
providing a substrate structure;
positioning a photosensitive material layer on said substrate structure;
positioning a mask layer on said photosensitive material layer, said mask layer comprising a 2D periodic pattern with period length greater than an exposing light source wavelength and comprising spatial variation in the duty cycle of the features of said mask layer, wherein a frequency of said spatial variation is less than a spacing frequency of said feature of said mask layer; and
illuminating with a light source said mask layer and photosensitive material layer to form a 3D micro-structure having uniform periodic geometry and period length throughout associated with the 2D periodic pattern.

2. The method of claim 1, wherein said substrate comprises a transparent substrate.

3. The method of claim 1, wherein said light source comprises monochromatic or spatially coherent light source.

4. The method of claim 1, wherein said light source is normally incident on the mask layer.

5. The method of claim 1, wherein said photosensitive material layer comprises a glass or polymer.

6. The method of claim 1, wherein said 3D micro-structure comprises a refractive index contrast between the photosensitive material layer and air.

7. The method of claim 1, wherein said mask layer comprises features that are fully attenuating.

8. A system for fabricating an optical structure comprising:
a substrate structure;
a photosensitive material layer is positioned on said substrate structure;
a mask layer is positioned on said photosensitive material layer, said mask layer comprising a 2D periodic pattern with period length greater than an exposing light source wavelength and comprising spatial variation in the duty cycle of the features of said mask layer, wherein a frequency of said spatial variation is less than a spacing frequency of said feature of said mask layer; and
a light source illuminating said mask layer and said photosensitive material layer to form a 3D micro-structure having uniform periodic geometry and period length throughout associated with the 2D periodic pattern.

9. The system of claim 8, wherein said substrate comprises a transparent substrate.

10. The system of claim 8, wherein said light source comprises monochromatic or spatially coherent light source.

11. The system of claim 8, wherein said light source is normally incident on the mask layer.

12. The system of claim 8, wherein said photosensitive material layer comprises a glass or polymer.

13. The system of claim 8, wherein said 3D micro-structure comprises a refractive index contrast between the photosensitive material layer and air.

14. The system of claim 8, wherein said mask layer comprises features that are fully attenuating.

15. An optical structure comprising:
a substrate structure; and
a photosensitive material layer comprising a 3D micro-structure being positioned on said substrate structure, said photosensitive material layer having uniform periodic geometry and a period length throughout associated with a 2D periodic pattern, said 2D periodic pattern comprising a period length greater than an exposing light source wavelength and comprising spatial variation in the duty cycle of the features of a mask layer used in the formation of said 2D periodic pattern, wherein a frequency of said spatial variation is less than a spacing frequency of said feature of said mask layer.

16. The optical structure of claim 15, wherein said substrate comprises a transparent substrate.

17. The optical structure of claim 15, wherein said exposing light wavelength comprises a wavelength association from a monochromatic or spatially coherent light source.

18. The optical structure of claim 17, wherein said light source is normally incident on the mask layer.

19. The optical structure of claim 15, wherein said photosensitive material layer comprises a glass or polymer.

20. The optical structure of claim 15, wherein said photosensitive material layer comprises a refractive index contrast with air.

21. The optical structure of claim 15, wherein said mask layer comprises features that are fully attenuating.

* * * * *